United States Patent
Yanase

(10) Patent No.: US 10,170,892 B2
(45) Date of Patent: Jan. 1, 2019

(54) LASER UNIT AND LASER DEVICE

(71) Applicants: AMADA MIYACHI CO., LTD., Isehara-shi, Kanagawa (JP); AMADA HOLDINGS CO., LTD., Isehara-shi, Kanagawa (JP)

(72) Inventor: Atsushi Yanase, Isehara (JP)

(73) Assignee: AMADA MIYACHI CO., LTD., Isehara-shi, Kanagawa (JP)

( * ) Notice: Subject to any disclaimer, the term of this patent is extended or adjusted under 35 U.S.C. 154(b) by 0 days.

(21) Appl. No.: 15/737,718

(22) PCT Filed: Jun. 3, 2016

(86) PCT No.: PCT/JP2016/066633
§ 371 (c)(1),
(2) Date: Dec. 18, 2017

(87) PCT Pub. No.: WO2016/203998
PCT Pub. Date: Dec. 22, 2016

(65) Prior Publication Data
US 2018/0191135 A1     Jul. 5, 2018

(30) Foreign Application Priority Data
Jun. 19, 2015  (JP) .................................. 2015-123471

(51) Int. Cl.
*H01S 5/40*  (2006.01)
*H01S 5/022* (2006.01)
(Continued)

(52) U.S. Cl.
CPC ........ *H01S 5/4012* (2013.01); *G02B 27/0905* (2013.01); *G02B 27/0916* (2013.01);
(Continued)

(58) Field of Classification Search
CPC ................ G02B 27/09; G02B 27/0905; G02B 27/0916; G02B 27/0972; G02B 27/0977;
(Continued)

(56) References Cited

U.S. PATENT DOCUMENTS 5,453,534 A     10/1995  Raven
6,993,059 B2 *   1/2006  Anikitchev ........ G02B 27/0977
                                                    372/100
(Continued)

FOREIGN PATENT DOCUMENTS

JP      2-290391 A    11/1990
JP      3-55841 U     5/1991
(Continued)

OTHER PUBLICATIONS

International Search Report for Application No. PCT/JP2016/066633, dated Aug. 23, 2016, 11 pages.
(Continued)

*Primary Examiner* — Loha Ben
(74) *Attorney, Agent, or Firm* — One LLP

(57) ABSTRACT

The light-concentration density or laser power of a combined laser beam bundle, obtained by combining individual laser beams that are caused to oscillate by and are output from a plurality of single-emitter LDs, is increased efficiently, with high quality. On a bottom plate or a unit base 22 of the laser unit 10, there are disposed: a pair of stacked laser beam creation units 24L, 24R which are arranged with left-right symmetry with respect to a center line N; a single wavelength stabilizing element (VBG) 26 of which an incidence plane vertically intersects the center line N; a pair of primary anamorphic prisms 28L, 28R which are arranged separately on the right and left of the center line N; a mirror-type beam rotation element 30 disposed on the center line N; and a secondary anamorphic prism 32 disposed offset
(Continued)

from the beam rotation element 30 in a direction (X-direction) perpendicular to the center line N.

10 Claims, 14 Drawing Sheets

(51) Int. Cl.
    *G02B 27/10*     (2006.01)
    *G02B 27/12*     (2006.01)
    *G02B 27/28*     (2006.01)
    *G02B 27/30*     (2006.01)
    *G02B 27/09*     (2006.01)
    *G02B 19/00*     (2006.01)

(52) U.S. Cl.
    CPC ......... *G02B 27/10* (2013.01); *G02B 27/1006* (2013.01); *G02B 27/126* (2013.01); *G02B 27/286* (2013.01); *G02B 27/30* (2013.01); *H01S 5/022* (2013.01); *H01S 5/40* (2013.01); *H01S 5/4087* (2013.01); *G02B 19/0052* (2013.01); *G02B 27/0972* (2013.01); *G02B 27/0977* (2013.01); *H01S 5/4025* (2013.01)

(58) Field of Classification Search
    CPC .. G02B 27/10; G02B 27/1006; G02B 27/106; G02B 27/12; G02B 27/14; G02B 27/283; G02B 27/30; G02B 19/0014; G02B 19/0023; G02B 19/0052; G02B 19/0057; G02B 6/4206; G02B 6/4214; G02B 6/425; G02B 27/126; G02B 27/286; H01S 5/00; H01S 5/005; H01S 5/0071; H01S 5/02236; H01S 5/02248; H01S 5/02288; H01S 5/02292; H01S 5/2036; H01S 5/4018; H01S 5/4031; H01S 5/4043; H01S 5/4025; H01S 5/4056; H01S 5/4012; H01S 5/4075; H01S 5/4087; H01S 5/405; H01S 2301/166; H01S 2301/18; H01S 5/022; H01S 5/40; F21V 7/0025; F21V 7/04
    USPC ............... 359/318, 618, 619, 625, 627, 629, 359/639–641; 362/19, 234, 240, 241, 362/257, 259, 268, 553, 555; 372/6, 372/21–23, 27, 50.12, 50.23, 70, 98–101, 372/106, 108; 385/33, 36
    See application file for complete search history.

(56) References Cited

U.S. PATENT DOCUMENTS

| | | | |
|---|---|---|---|
| 7,006,549 B2* | 2/2006 | Anikitchev | G02B 27/09 372/107 |
| 8,488,245 B1* | 7/2013 | Chann | G02B 19/0014 353/34 |
| 9,214,786 B2* | 12/2015 | Hemenway | H01S 5/2036 |
| 9,377,611 B2* | 6/2016 | Govorkov | H01S 5/024 |
| 9,627,852 B2* | 4/2017 | Hemenway | H01S 5/02284 |
| 2012/0002395 A1 | 1/2012 | Du et al. | |
| 2017/0288364 A1* | 10/2017 | Hemenway | H01S 5/02284 |

FOREIGN PATENT DOCUMENTS

| | | |
|---|---|---|
| JP | 5-509179 A | 12/1993 |
| JP | 9-109353 A | 4/1997 |
| JP | H09109353 A | 4/1997 |
| JP | B0003078836 | 6/2000 |
| JP | 2004-93827 A | 3/2004 |
| JP | 2004-239840 A | 8/2004 |
| JP | 2005-217267 A | 8/2005 |
| JP | 2006-60085 A | 3/2006 |
| JP | 2010-263063 A | 11/2010 |
| JP | 2012-135808 A | 7/2012 |
| JP | 2014-120621 A | 6/2014 |
| WO | WO 92/02844 A1 | 2/1992 |

OTHER PUBLICATIONS

Japanese Office action for Application No. 2016-563489, dated Jan. 29, 2017, 9 pages (with English translation).
Decision to Grant a Patent for JP 2016-563489 dated May 10, 2017, including English translation, 6pp.

* cited by examiner

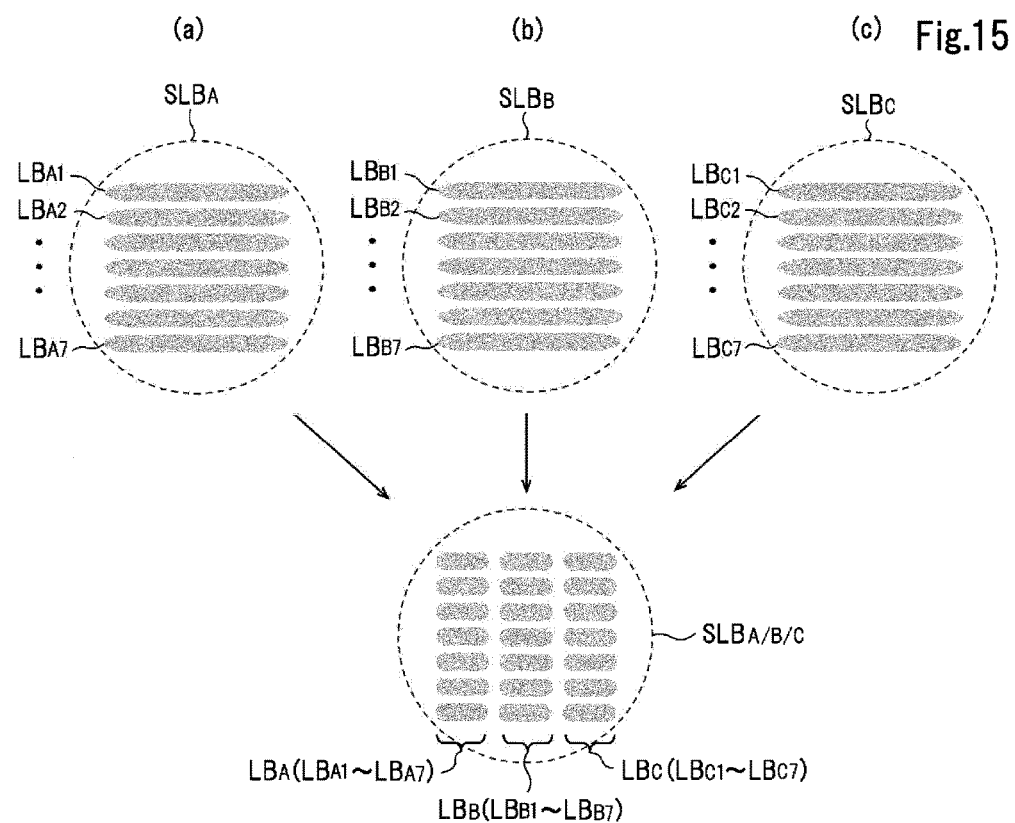
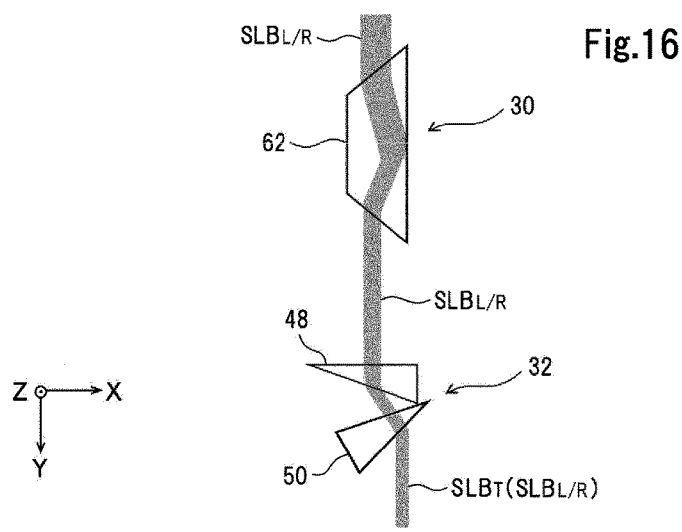

LASER UNIT AND LASER DEVICE

CROSS-REFERENCE TO RELATED APPLICATIONS

This application is a National Phase Patent Application of International Patent Application Number PCT/JP2016/066633, filed on Jun. 3, 2016, which claims priority to Japanese Patent Application No. 2015-123471, filed on Jun. 19, 2015, the entire disclosures of both of which are incorporated by reference herein.

TECHNICAL FIELD

The present invention relates to a laser unit and a laser device that provide a high-power and high-brightness laser beam using a plurality of single emitters LDs.

BACKGROUND ART

In recent years, in the field of laser processing, there have been many attempts to use a semiconductor laser or a laser diode such as a fiber laser or a YAG laser, which has been used mainly in an excitation light source, directly in a laser processing light source as a direct diode laser (DDL). DDL is roughly divided into that of an array method which uses a combination of a plurality of bar-shaped LD arrays formed monolithically by arranging a plurality of LDs in a horizontal row and that of a single emitter method which uses a combination of a plurality of single LD chips or single emitters LDs. In either system, laser beams emitted simultaneously by a plurality of LDs are combined into a bundle of beams and are usually provided to applications such as laser processing through an optical fiber.

In the array method, generally a plurality of LD arrays are stacked to form a stacked LD module and provides a bundle of combined laser beams directly from the LD module. This method appears to be an efficient method since laser beams emitted from individual LDs are combined into one bundle immediately after emission. However, in fact, since the emission surface size of the entire LD array or the entire LD module is large, the accuracy of collimation and concentration of the combined laser beams is low. Moreover, since individual beams interfere with each other, coupling efficiency is not so high. Thus, the array method is disadvantageous.

In contrast, in the single emitter method (for example, see Non-Patent Documents 1 and 2), a plurality of single emitters LDs are arranged discretely at desired distances, and single laser beams emitted respectively from these single emitters LDs are collimated individually in a fast axis direction and a slow axis direction. Subsequently, the single laser beams are combined into a bundle in a non-contacting manner so as not to cause mutual interference. Therefore, the single emitter method is advantageous in obtaining a high-power and high-brightness laser beam.

CITATION LIST

Non-Patent Document

Non-Patent Document 1: Haro Fritsche et. al., "High Brightness, Direct Diode Laser with kW Output Power," Direct Photonics Industries, 2014

Non-Patent Document 2: Scott R. Karlsen Fritsche, et. al., "100-W 105-μm, 0.15 NA Fiber Coupled Laser Diode Module," nLIGHT, 2009

SUMMARY OF THE INVENTION

Problems to be Solved by the Invention

However, a conventional laser device which employs the single emitter method combines the collimated individual single laser beams into a bundle without changing the beam size thereof. Therefore, there is a limit to the number or the density of single laser beams included in the combined laser beam. Consequently, there is a limit on the laser power exerted in a DDL and the thinness of the optical fiber used in the fiber coupling method.

The present invention solves the problems of the conventional technology and an object thereof is to provide a laser unit and a laser device capable of efficiently improving the light-concentration density and the laser power of a bundle of combined laser beams obtained by combining individual laser beams oscillated and output from a plurality of single emitters LDs with high quality.

Solutions to Problems

A laser unit according to the present invention includes: a first stacked laser beam creation unit that has a plurality of first single emitters LDs disposed in a first direction at a predetermined pitch and at different height positions and that arranges a plurality of first single laser beams having wavelengths identical or proximate to a standard wavelength, emitted respectively from the plurality of first single emitters LDs in a stacked form and in a non-contacting manner to create a bundle of first stacked laser beams; a second stacked laser beam creation unit that is disposed to be adjacent to the first stacked laser beam creation unit and has a plurality of second single emitters LDs disposed in the first direction at the pitch and at different height positions and that arranges a plurality of second single laser beams having wavelengths identical or proximate to the standard wavelength, emitted respectively from the plurality of second single emitters LDs in a stacked form and in a non-contacting manner to create a bundle of second stacked laser beams; a first anamorphic prism that allows the first stacked laser beam from the first stacked laser beam creation unit to pass therethrough so that a beam size of the individual first single laser beams that form the first stacked laser beam is compressed by a first compression ratio in one of a fast-axis direction and a slow-axis direction and an optical path of the first stacked laser beam is shifted toward the second stacked laser beam side; and a second anamorphic prism that allows the second stacked laser beam from the second stacked laser beam creation unit to pass therethrough so that a beam size of the individual second single laser beams that form the second stacked laser beam is compressed by a second compression ratio in the one of the fast-axis direction and the slow-axis direction and an optical path of the second stacked laser beam is shifted toward the first stacked laser beam side, wherein the laser unit provides a bundle of combined stacked laser beams obtained by combining the first stacked laser beam and the second stacked laser beam in parallel.

In the laser unit having the above-described configuration, during the course in which two bundles of stacked laser beams respectively obtained from the two sets of single emitters LDs pass through the first and second anamorphic prisms, the image size of the single laser beams that form both of the stacked laser beams is compressed and, simultaneously, both of the stacked laser beams approach each other. In this way, two lines of bundles of high-density laser beams are combined. Therefore, it is possible to improve the light-concentration density and the laser power of the laser beam with high quality.

A first laser device according to the present invention includes: the first laser unit according to the present invention that emits a first combined stacked laser beam in a fourth direction orthogonal to the first direction; the second laser unit according to the present invention that emits a second combined stacked laser beam in a fifth direction orthogonal to the first and fourth directions; and a spatial coupling element that has a transmission portion and a reflection portion arranged to be adjacent to each other in a direction inclined by 45° with respect to the fourth and fifth directions, the spatial coupling element allowing the first combined stacked laser beam from the first laser unit and the second combined stacked laser beam from the second laser unit to be selectively incident on the transmission portion or the reflection portion to combine the first combined stacked laser beam and the second combined stacked laser beam into a bundle of laser beams in a multiplexed manner and in a non-contacting manner.

Since the laser device having the above-described configuration further combines a plurality of combined stacked laser beams obtained respectively from the present invention laser units of the present invention in a multiplexed manner by spatial coupling, it is possible to further increase the laser power with high quality.

A second laser device according to the present invention includes: the first laser unit according to the present invention that emits a first combined stacked laser beam in a fourth direction orthogonal to the first direction; the second laser unit according to the present invention that emits a second combined stacked laser beam in a fifth direction orthogonal to both the first and fourth directions; and a polarizing coupling element that combines the first combined stacked laser beam from the first laser unit and the second combined stacked laser beam from the second laser unit into a bundle of laser beams in a multiplexed manner by polarization coupling.

Since the laser device having the above-described configuration further combines a plurality of combined stacked laser beams obtained from a plurality of the laser units of the present invention in a multiplexed manner by polarization coupling, it is possible to further increase the laser power with high quality.

A third laser device according to the present invention includes: the first laser unit according to claim 5 or the present invention that emits a first combined stacked laser beam having a wavelength near a first standard wavelength in a fourth direction orthogonal to the first direction; the second laser unit according to the present invention that emits a second combined stacked laser beam having a wavelength near a second standard wavelength that does not interfere with the first standard wavelength in a fifth direction orthogonal to the first and fourth directions; and a wavelength coupling element that combines the first combined stacked laser beam from the first laser unit and the second combined stacked laser beam from the second laser unit into a bundle of laser beams in a multiplexed manner by wavelength coupling.

Since the laser device having the above-described configuration further combines a plurality of combined stacked laser beams respectively obtained from a plurality of the laser units of the present invention in a multiplexed manner by wavelength coupling, it is possible to further increase the laser power with high quality.

Effects of the Invention

According to the laser unit or the laser device of the present invention, due to the above-described configuration and operation, it is possible to efficiently improve the light-concentration density and the laser power of a bundle of combined laser beams obtained by combining single laser beams oscillated and output from a plurality of single emitters LDs with high accuracy.

BRIEF DESCRIPTION OF DRAWINGS

FIG. 15 is a diagram illustrating patterns (images) of laser beams in respective portions of the anamorphic prism assembly illustrated in FIG. 14.

FIG. 16 is a diagram illustrating another configuration example of a beam rotation element.

DESCRIPTION OF EMBODIMENT

Hereinafter, preferred embodiments of the present invention will be described with reference to the accompanying drawings.

Embodiment of Laser Unit

Figure 1:
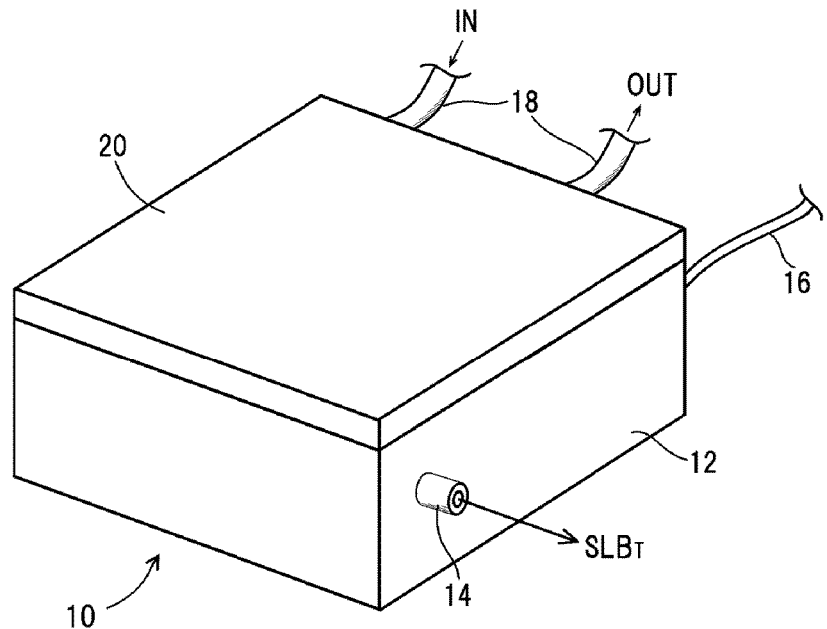
FIG. 1 is a perspective view illustrating an outer configuration of a laser unit according to an embodiment of the present invention.

FIG. 1 illustrates an appearance of a laser unit according to an embodiment of the present invention. A laser unit 10 is provided as an independent unit having such a housing 12 as in the drawing when a laser unit 10 is used for applications such as laser processing in a single unit as a DDL. A laser emission port 14 is formed in one side surface of the housing 12, and a bundle of combined laser beams $SLB_T$ is emitted towards the outside of the unit from the laser emission port 14 when laser is oscillated and output. When a fiber coupling method is employed, one end of an optical fiber (not illustrated) is attached to the laser emission port 14 via an optical connector (not illustrated). Various connectors (not illustrated) for connection to an electric cable 16 from a laser power supply (not illustrated), a coolant supply tube 18 from a chiller (not illustrated), and the like are formed on the other side surface of the housing 12. A lid 20 which is opened as necessary for maintenance or the like is provided on an upper surface of the housing 12.

Figure 2:
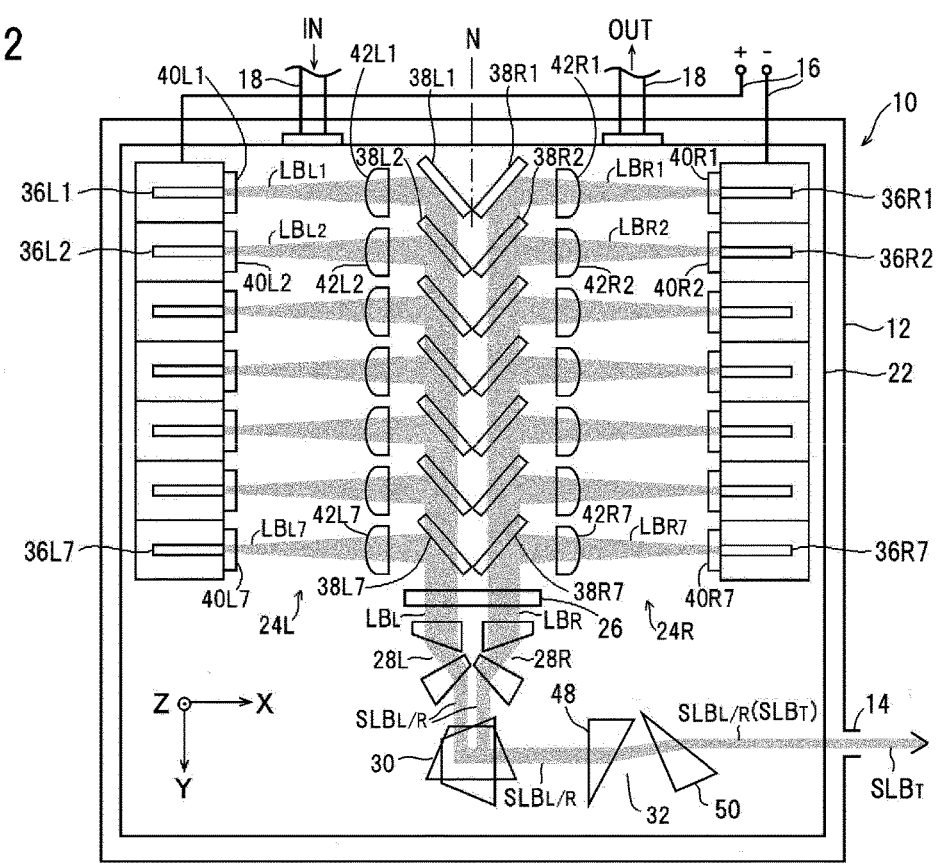
FIG. 2 is a plan view illustrating major configurations inside the laser unit.

FIG. 2 illustrates major configurations within the laser unit 10 (particularly, an arrangement structure (a layout) of major components) in a plan view. FIG. 3A to 6 illustrate a configuration and an operation of respective portions inside the unit 10.

A planar unit base 22 formed of a member having high heat conductivity (for example, copper) which is mounted with and supports all components in the unit and functions as a heats ink is disposed at the bottom of the laser unit 10. Passages (not illustrated) through which the coolant supplied via the coolant supply tube 18 travels to respective portions are formed inside the unit base 22.

A pair of stacked laser beam creation units 24L and 24R that are bilaterally symmetric relative to a center line N extending in a Y-direction in FIG. 2 are provided on the unit base 22. Furthermore, a single wavelength stabilizing element (for example, VBG 26) of which the incidence plane perpendicularly intersects the center line N, a pair of primary anamorphic prisms 28L and 28R arranged to be separated to left and right sides of the center line N, a mirror-type beam rotation element 30 disposed on the center line N, and a secondary anamorphic prism 32 disposed to be offset in a direction (X-direction) orthogonal to the center line N from the beam rotation element 30 are provided on a downstream side or a rear stage of both of the stacked laser beam creation units 24L and 24R along a travelling direction of a laser beam.

Figure 3A:
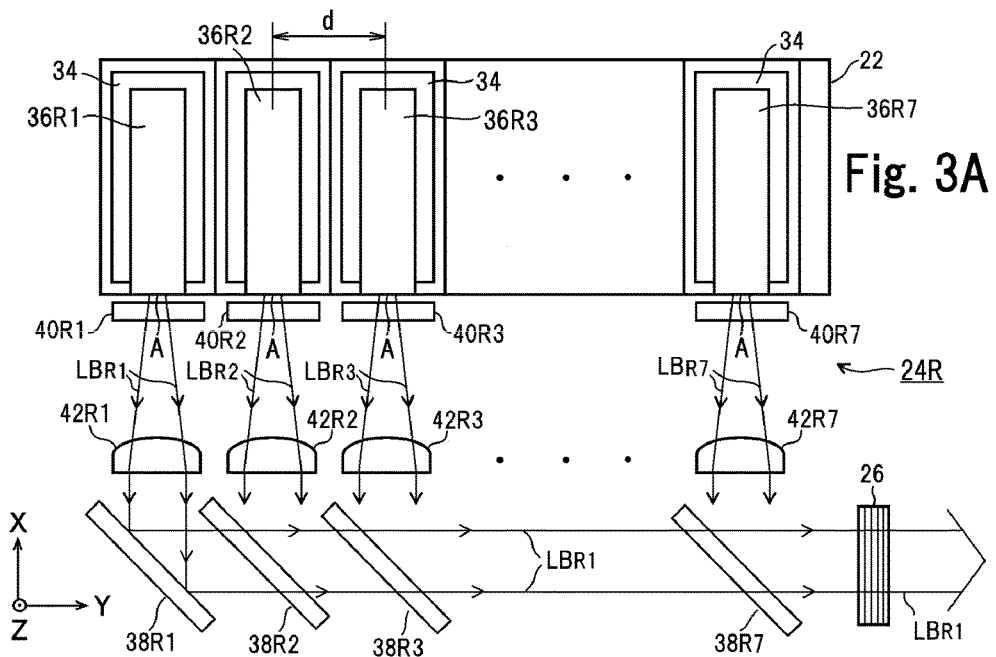
FIGS. 3A, 3B and 3C are plan views illustrating configurations and operations of major portions of a stacked laser beam creation unit of the laser unit.
Figure 3B:
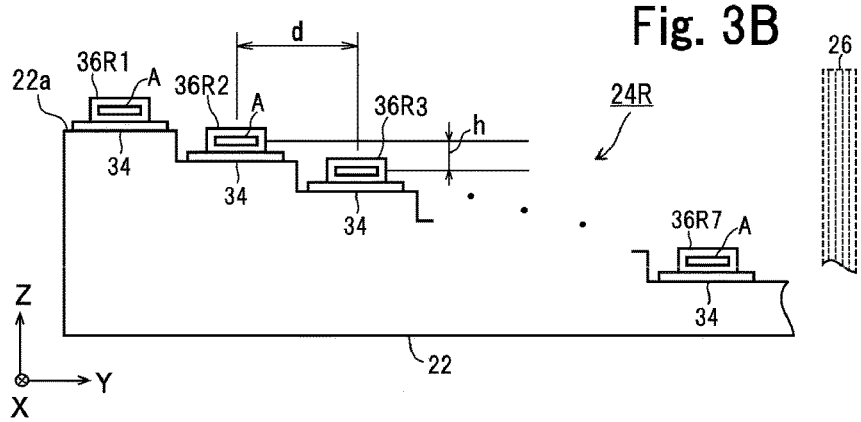

In one stacked laser beam creation unit 24R (on the right side in FIG. 2), as illustrated in FIG. 3B, the upper surface of the unit base 22 rises in a step form from the side close to the VBG 26 toward the upstream side of the laser beam (a step-shaped LD supporting portion 22a is formed), and a plurality of (seven in the illustrated example) single emitters LDs 36R1, 36R2, . . . , and 36R7 are placed on the upper surfaces of the respective steps with an insulator (for example, a ceramic member 34) having high heat conductivity interposed therebetween respectively. Here, each of the single emitters LDs 36Rn (n=1, 2, . . . , 7) are disposed so that the laser emission surface A thereof faces the center line N (that is, the X-direction).

When the bottom surfaces of the laser unit 10 and the unit base plate 22 are seen in a plan view as the XY plane, as illustrated in FIG. 2 and FIG. 3A, these single emitters LDs 36R1, 36R2, . . . , and 36R7 are arranged in a row at constant intervals d in parallel to the center line N (that is, in the Y-direction). Moreover, in a unit height direction (that is, the Z-direction) perpendicular to the XY plane, as illustrated in FIG. 3B, these single emitters LDs 36R1, 36R2, . . . , and 36R7 are arranged such that the arrangement positions (that is, the height positions of the laser emission surfaces A) differ by a pitch h corresponding to the level difference of the steps.

Total-reflection mirrors 38R1, 38R2, . . . , and 38R7 are arranged on forward sides of the laser emission surfaces A of the single emitters LDs 36R1, 36R2, . . . , and 36R7 in such a position that the reflecting surfaces thereof are tilted by 45° in both X- and Y-directions in front of the center line N. That is, the respective mirrors 38Rn are tilted by 45° in the X-direction to face the corresponding single emitters LDs 36Rn and are tilted by 45° in the Y-direction to face the VBG 26.

Here, the apexes of respective mirrors 38Rn excluding the mirror 38R1 at the highest position in the Z-direction are higher than the laser emission surfaces A of the corresponding single emitter LD 36Rn and are lower than the laser emission surface A of an adjacent single emitter LD 36Rn–1 which is one step higher than the single emitter LD 36Rn. According to such an arrangement, a single laser beam $LB_{R1}$ emitted in the X-direction from the single emitter LD 36R1 at the end disposed at the highest position is incident on the mirror 38R1 at an incidence angle of 45° and is totally reflected at a right angle from the mirror, and as illustrated in FIG. 3C, travels along a straight line in the Y-direction above the heads of the mirrors 38R2, . . . , and 38R7 on the rear stage and is incident on the VBG 26 at the highest position.

Figure 3C:
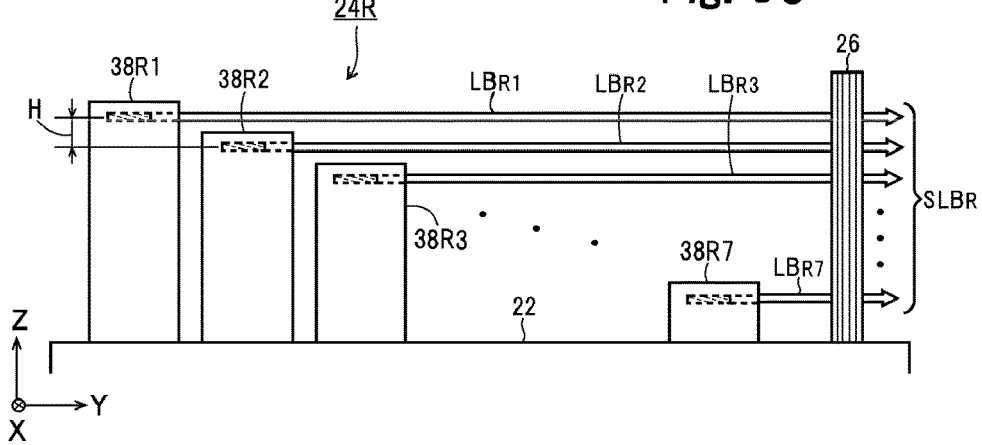

Moreover, a single laser beam $LB_{R2}$ emitted in the X-direction from the single emitter LD 36R2 which is the second highest and disposed adjacent to the single emitter LD 36R1 at the end is incident on the mirror LD 38R2 at an incidence angle of 45° and is totally reflected at aright angle from the mirror, and as illustrated in FIG. 3C, travels along a straight line in the Y-direction above the heads of the mirrors 38R3, . . . , and 38R7 on the rear stage and is incident on the VBG 26 at the second highest position. Moreover, a single laser beam $LB_{R7}$ emitted in the X-direction from the single emitter LD 36R7 at the other end or a terminal end is incident on the mirror 38R7 at an incidence angle of 45° and is totally reflected at a right angle (that is, in the Y-direction) from the mirror, and as illustrated in FIG. 3C, is incident on the VBG 26 at the lowest position.

A fast-axis collimator lens 40Rn and a slow-axis collimator lens 42Rn are disposed on an optical path between the single emitter LD 36Rn and the mirror 38Rn facing each other. The fast-axis collimator lens 40Rn is disposed to be adjacent to the laser emission surface A of the single emitter LD 36Rn so as to collimate a beam size of a single laser beam $LB_{Rn}$ immediately after being emitted from the single emitter LD 36Rn in a fast-axis direction. Moreover, the slow-axis collimator lens 42Rn is disposed on a backward side of the fast-axis collimator lens 40Rn as seen from the single emitter LD 36Rn so as to collimate a beam size of the single laser beam $LB_{Rn}$ in a slow-axis direction.

Figure 6:
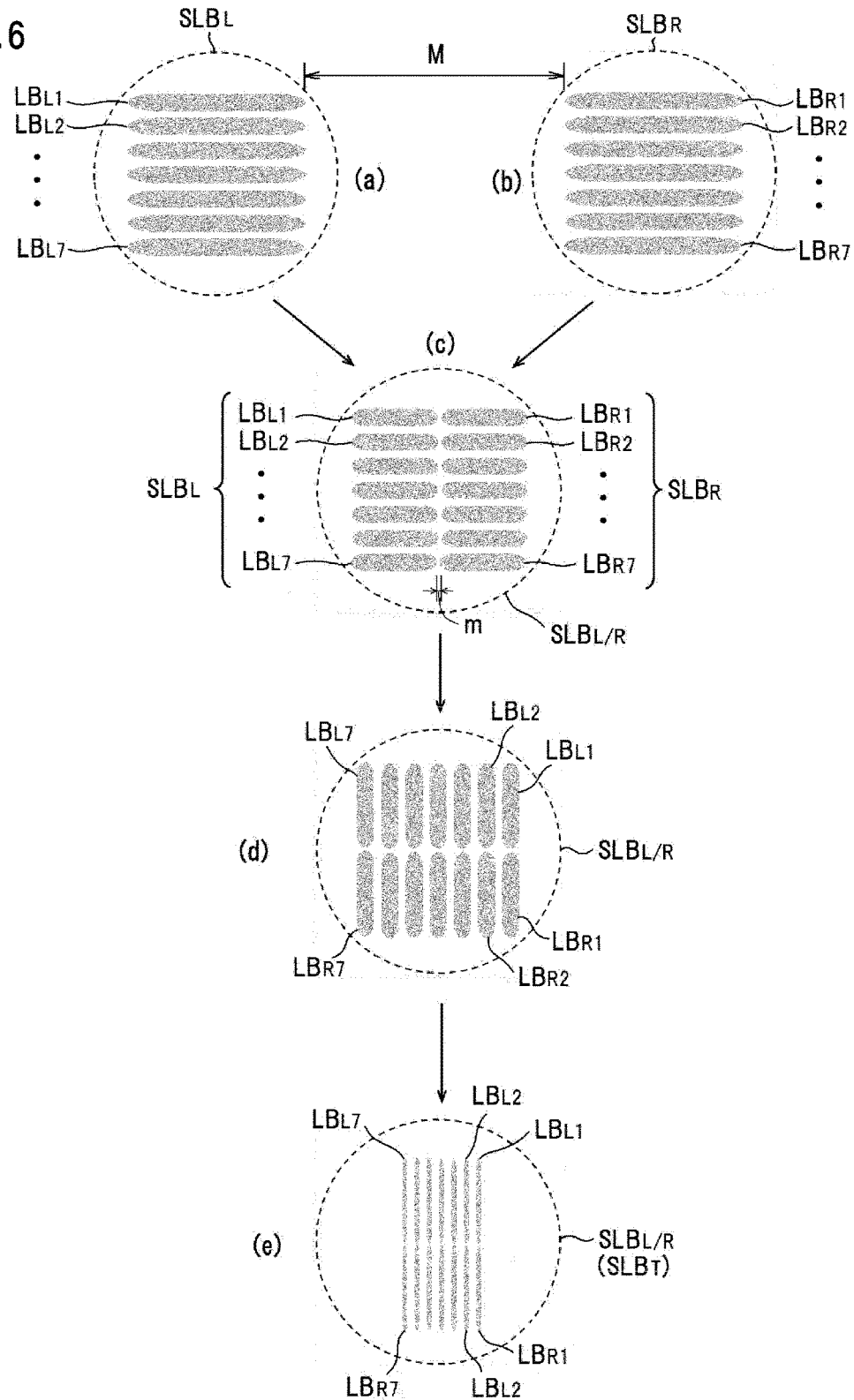
FIG. 6 is a diagram illustrating patterns (images) of laser beams of respective major portions of the laser unit.

In the right-side stacked laser beam creation unit 24R having the above-described configuration, as illustrated in FIG. 2, FIG. 3A, and FIG. 3C, a plurality of (seven) single laser beams $LB_{R1}$, $LB_{R2}$, . . . , and $LB_{R7}$ emitted from the plurality of single emitters LDs 36R1, 36R2, . . . , and 36R7, respectively, propagate through the air in parallel to the Y-direction while being arranged in the Z-direction in a stacked form and in a non-contacting manner after being reflected from the mirrors 38R1, 38R2, . . . , and 38R7 to form one vertical line of a bundle of second stacked laser beams $SLB_R$ as illustrated in part(b) of FIG. 6 and are incident on the right-side region of FIG. 2 with respect to the center line N of the VBG 26.

The single emitters LDs 36R1, 36R2, . . . , and 36R7 are single LD chips of the same specifications and are electrically serially connected by an electrode plate or wires (not illustrated) and oscillate and output the single laser beams $LB_{R1}$, $LB_{R2}$, . . . , and $LB_{R7}$ having a wavelength identical to or proximate to a constant standard wavelength (for example, 880 nm) under DC electric power supplied through the electric cable 16 from a laser power supply.

The other stacked laser beam creation unit 24L (on the left side in FIG. 2) has the same configuration and function as those of the right-side stacked laser beam creation unit 24R except that the stacked laser beam creation unit 24L is symmetric to the right-side stacked laser beam creation unit 24R with respect to the center line N. Therefore, in the left-side stacked laser beam creation unit 24L, a plurality of (seven) single laser beams $LB_{L1}$, $LB_{L2}$, . . . , and $LB_{L7}$ emitted from a plurality of (seven) single emitters LDs 36L1, 36L2, . . . , and 36L7 propagate through the air in parallel to the Y-direction in a state of being arranged in the Z-direction in a stacked form and in a non-contacting manner after being reflected from the mirrors 38L1, 38L2, . . . , and 38L7, respectively, to form one vertical line of a bundle of first stacked laser beams $SLB_L$ as illustrated in FIG. 6A and are incident on the left-side region in FIG. 2 with respect to the center line N of the VBG 26.

The VBG (Volume Bragg Grating) 26 forms an external resonator and narrows a wavelength width of laser oscillation of the single emitters LDs (36L1, 36L2, . . . , and 36L7) and (36R1, 36R2, . . . , and 36R7), and suppresses fluctuation in the central wavelength so that the wavelength thereof is locked at a value near the standard wavelength (880 nm). In this embodiment, since the sole or single VBG 26 is shared by all single emitters LDs in the unit, it is possible to reduce the cost and, in addition, the accuracy of the bandwidth narrowing and the wavelength locking is stable. VHG (Volume Holographic Grating) can be also used as the wavelength stabilizing element.

The first stacked laser beams $SLB_L$ ($LB_{L1}$ to $LB_{L7}$) and the second stacked laser beams $SLB_R$ ($LB_{R1}$ to $LB_{R7}$) emitted from the VBG 26 are arranged approximately at the same height in the vertical direction (the Z-direction) and are greatly separated in the horizontal direction (the X-direction) by a distance M (FIGS. 4 and 6) depending on a spatial margin between the left and right mirrors (38L1 to 38L7) and (38R1 to 38R7) within both stacked laser beam creation units 24L and 24R. In this state, the first and second stacked laser beams $SLB_L$ and $SLB_R$ are incident on the left and right primary anamorphic prisms 28L and 28R, respectively.

Figure 4:
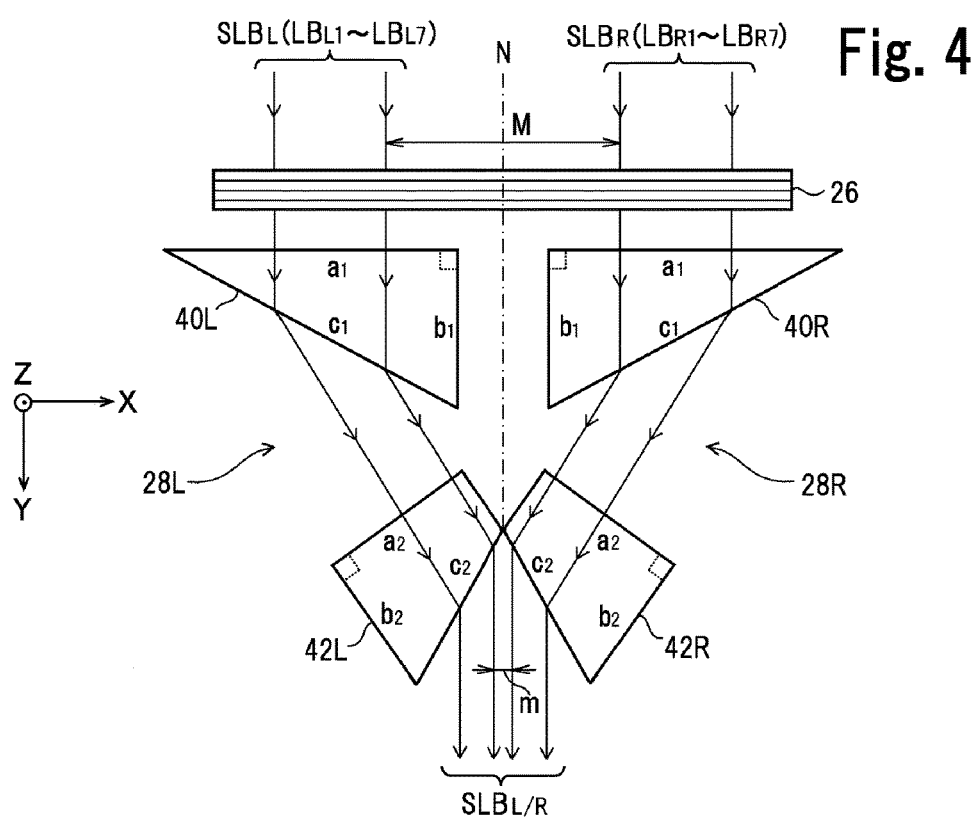
FIG. 4 is a plan view illustrating a configuration and an operation of a primary anamorphic prism of the laser unit.

As illustrated in FIG. 4, the right-side primary anamorphic prism 28R is configured with a front-stage right-angle prism 40R which is positioned near the VBG 26 and is disposed so that one (the longer) adjoining side $a_1$ faces in parallel to the VBG 26 and the other (the shorter) adjoining side $b_1$ faces in parallel to the center line N, and a rear-stage right-angle prism 42R which is positioned on a backward side of the front-stage right-angle prism 40R in a beam travelling direction (the Y-direction) and is disposed so that one adjoining side $a_2$ obliquely faces an oblique side $c_1$ of the front-stage right-angle prism 40R at a certain angle and an oblique side $c_2$ obliquely faces the center line N at a close distance.

The right-side second stacked laser beam $SLB_R$ having passed through the VBG 26 in the Y-direction sequentially passes through the front-stage right-angle prism 40R and the rear-stage right-angle prism 42R of the right-side primary anamorphic prism 28R while bending the optical path as illustrated in the drawing and exits in the Y-direction. In this case, an image size (length) of the individual single laser beams $LB_{R1}$ to $LB_{R7}$ that form the second stacked laser beam $SLB_R$ is compressed to ½ by a predetermined compression ratio of 0.5, for example, in the slow-axis direction (FIG. 6B to 6C).

Furthermore, since a large part of the corner portion between the adjoining side $a_2$ and the oblique side $c_2$ of the rear-stage right-angle prism 42R is cut off, and the oblique side $c_2$ is brought close to the center line N as much as possible, the optical path of the first stacked laser beam $SLB_R$ ($LB_{R1}$ to $LB_{R7}$) immediately after passing through the rear-stage right-angle prism 42R is shifted greatly in the X-direction so that the optical path almost makes contact with the center line N.

The left-side primary anamorphic prism 28L has the same configuration as the right-side primary anamorphic prism 28R and both primary anamorphic prisms are disposed line-symmetric relative to the center line N. The left-side first stacked laser beam $SLB_L$ having passed through the VBG 26 in the Y-direction sequentially passes through front- and rear-stage right-angle prisms 40L and 42L of the left-side primary anamorphic prism 28L along an optical path that is line-symmetric to that of the right-side second stacked laser beam $SLB_R$.

According to such an arrangement, the image size (length) of the individual single laser beams $LB_{L1}$ to $LB_{L7}$ that form the first stacked laser beam $SLB_L$ is compressed to ½ by a predetermined compression ratio of 0.5, for example part (a) to (c) in FIG. 6). The optical path of the first stacked laser beam $SLB_L$ ($LB_{L1}$ to $LB_{L7}$) after exiting from the left-side primary anamorphic prism 28L is greatly shifted in the X-direction so that of the optical path almost makes contact with the center line N.

In this way, on the rear stage of the pair of left and right-side primary anamorphic prisms 28L and 28R, as illustrated in a part (c) of FIG. 6, a bundle of combined stacked laser beams $SLB_{L/R}$ wherein the first stacked laser beam $SLB_L$ and the second stacked laser beam $SLB_R$ are arranged in two horizontal lines with a very small gap 'm' interposed therebetween is obtained.

As illustrated in FIG. 2, the combined stacked laser beam $SLB_{L/R}$ passes through the mirror-type beam rotation element 30 in which the pattern or the image of the beam rotates by 90° and the optical path or the travelling direction of the beam is bent at a right angle from the Y-direction to the X-direction.

Figure 5:
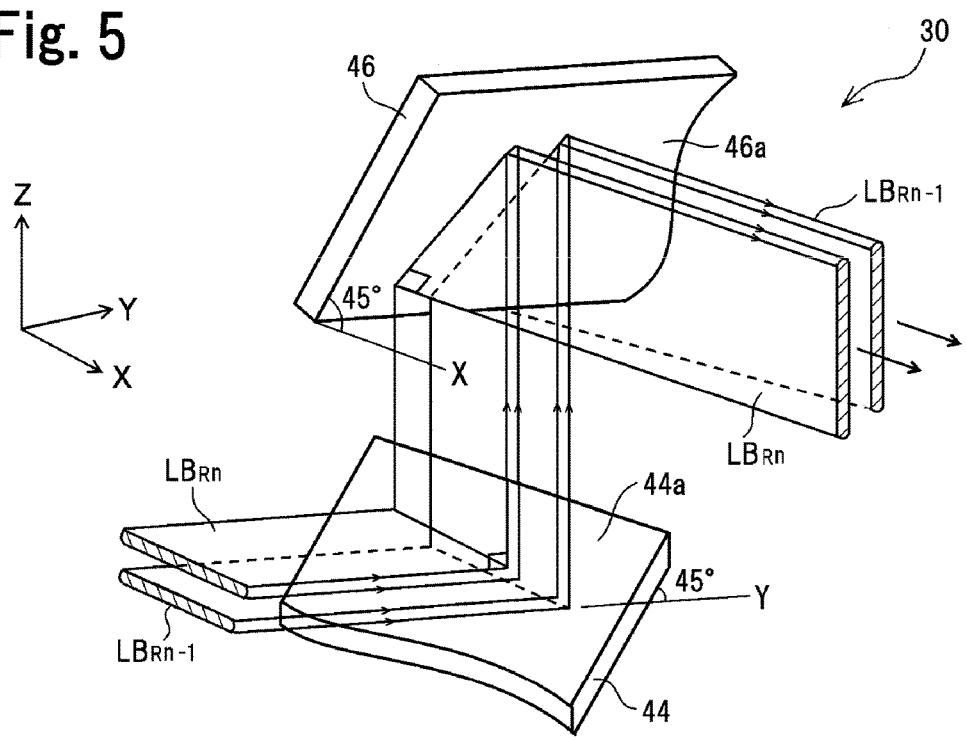
FIG. 5 is a plan view illustrating a configuration and an operation of a beam rotation element of the laser unit.

As illustrated in FIG. 5, the beam rotation element 30 is configured with a pair of total-reflection mirrors 44 and 46 that obliquely face each other in the up-down direction (the Z-direction). Here, the front-stage mirror 44 has a reflecting surface 44a formed at a position intersecting the center line N so as to be parallel to the X-direction and be tilted by 45° in the Y-direction, and the front-stage mirror 44 is disposed so that the combined stacked laser beam $SLB_{L/R}$ having passed through the primary anamorphic prisms 28L and 28R is incident on the reflecting surface 44a. The rear-stage mirror 46 has a reflecting surface 46a that is parallel to the Y-direction and is tilted by 45° in the X-direction, and the rear-stage mirror 46 is disposed so that the combined stacked laser beam $SLB_{L/R}$ reflected from the reflecting surface 44a of the front-state mirror 44 is incident on the reflecting surface 46a.

FIG. 5 schematically illustrates a mechanism of how a beam image rotates by 90° and a mechanism of how a beam's optical path is bent at a right angle from the Y-direction to the X-direction with respect to some (two) single laser beams $LB_{Rn-1}$ and $LB_{Rn}$ of the combined stacked laser beam $SLB_{L/R}$. Whether the rear-stage mirror 46 will be disposed above or below the front-stage mirror 44, and whether the travelling direction (orientation) of the combined stacked laser beam $SLB_{L/R}$ reflected from the rear-stage mirror 46 will be leftward or rightward, and the like can be selected as desired within the range of design matters.

In this way, when the image of the combined stacked laser beam $SLB_{L/R}$ is rotated by 90° by the beam rotation element 30, the mutual positional relation between the first stacked laser beam $SLB_L$ and the second stacked laser beam $SLB_R$ changes from the previous horizontal two-line relation (in the part (C) of FIG. 6) to a vertical two-line relation (in the part (d) of FIG. 6). However, the coupling relation of both stacked laser beams $SLB_L$ and $SLB_R$ is maintained without any change.

Subsequently, the combined stacked laser beam $SLB_{L/R}$ passes through the secondary anamorphic prism 32 in the X-direction at the rear stage of the beam rotation element 30 in which the image size (thickness) of the individual single laser beams $LB_{L1}$ to $LB_{L7}$ and $LB_{R1}$ to $LB_{R7}$ that form the combined stacked laser beam $SLB_{L/R}$ is compressed to ½ by a predetermined compression ratio of 0.5, for example, in the fast-axis direction (part (d) to (e) of FIG. 6). In this case, the space or the interval between the adjacent single laser beams LBs is reduced by the same compression ratio (½).

The travelling direction (the X-direction) of the combined stacked laser beam $SLB_{L/R}$ does not change before the combined stacked laser beam $SLB_{L/R}$ is incident on the secondary anamorphic prism 32 and after the beam passes through the prism, but the optical path is slightly shifted in a horizontal direction (the Y-direction). There is no particular significance to this shift amount. In addition, the shape and the arrangement positions of the front and rear-stage right-angle prisms 48 and 50 that form the secondary anamorphic prism 32 have no particular limitation like the primary anamorphic prisms 28L and 28R do have (FIG. 4).

The combined stacked laser beam $SLB_{L/R}$ is output towards the outside of the unit housing 12 from the laser emission port 14 as a combined stacked laser beam $SLB_T$ for one unit after passing through the secondary anamorphic prism 32. When a fiber coupling method is employed, one end portion of an optical fiber is attached to the laser emission port 14 via an optical connector, and a condensing lens (not illustrated) is provided between the secondary anamorphic prism 32 and the laser emission port 14. When the combined stacked laser beam $SLB_T$ is incident on the optical fiber, the stacked laser beams $SLB_R$ and $SLB_L$ that form the combined stacked laser beam $SLB_T$ and the single laser beams $LB_{L1}$ to $LB_{L7}$ and $LB_{R1}$ to $LB_{R7}$ are coupled, respectively, during the course of propagating through the optical fiber.

As described above, according to the laser unit 10 of this embodiment, in a pair of stacked laser beam creation units 24L and 24R, a plurality of single emitters LDs (36L1 to 36L7 and 36R1 to 36R7) are arranged in a step form while divided into two lines or two sets (36L1 to 36L7) and (36R1 to 36R7), and a plurality of single laser beams ($LB_{L1}$ to $LB_{L7}$) and ($LB_{R1}$ to $LB_{R7}$) emitted discretely from these single emitters LDs are individually collimated to form one bundle of stacked laser beams $SLB_L$ and $SLB_R$ for each set. Although these two sets of stacked laser beams $SLB_L$ and $SLB_R$ translate in a certain direction (the Y-direction) approximately at the same height, the two sets of beams are separated by a considerably large distance in the horizontal direction (the X-direction). When these two sets of stacked laser beams $SLB_L$ and $SLB_R$ pass through the pair of primary anamorphic prisms 28L and 28R, respectively, the image size or length of the respective single laser beams ($LB_{L1}$ to $LB_{L7}$ and $LB_{R1}$ to $LB_{R7}$) is compressed and, simultaneously, both stacked laser beams $SLB_L$ and $SLB_R$ approach each other. In this way, a bundle of two lines of high-density combined stacked laser beams $SLB_{L/R}$ are obtained.

In this laser unit 10, since all components of both stacked laser beam creation units 24L and 24R are mounted on the same unit base 22 having a heatsink function, the positional accuracy of and between the respective optical components is very high and stable. Moreover, the relative positional relational accuracy between the single laser beams ($LB_{L1}$ to $LB_{L7}$ and $LB_{R1}$ to $LB_{R7}$) and between the stacked laser beams $SLB_L$ and $SLB_R$ is high and stable. Therefore, it is possible to reliably avoid mutual interference between the single laser beams and between the stacked laser beams in the combined laser beam $SLB_{L/R}$ and to obtain a high-density and high-quality combined stacked laser beam $SLB_{L/R}$.

Furthermore, in this embodiment, the secondary anamorphic prism 32 narrows the image size or thickness of the individual single laser beams $LB_{L1}$ to $LB_{L7}$ and $LB_{R1}$ to $LB_{R7}$ that form the combined stacked laser beam $SLB_{L/R}$ and the interval between these single laser beams LBs by a predetermined compression ratio in the fast-axis direction. In this way, as will be described later, multiplex combination between the combined stacked laser beam $SLB_T$ ($SLB_{L/R}$) and other combined laser beams of the same type can be performed elaborately and accurately outside the laser unit 10.

Moreover, in this embodiment, since the mirror-type beam rotation element 30 rotates the image of the combined stacked laser beam $SLB_{L/R}$ by 90° and simultaneously bends the beam travelling direction at a right angle, easily understood from FIG. 2, it is possible to reduce the size of the unit base (heatsink) 22 and the laser unit 10 dramatically in a longitudinal direction (the Y-direction).

Embodiment of Laser Device

Hereinafter, an embodiment of a laser device according to the present invention will be described with reference to FIGS. 7 to 14.

A laser device according to an embodiment of the present invention includes a plurality of the above described laser units 10, and combines a plurality of combined laser beams provided from the respective laser units 10 in a multiplexed manner according to a coupling method to be described later so that a combined laser beam having integer multiples of light-concentration density and laser power is obtained.

Figure 7:
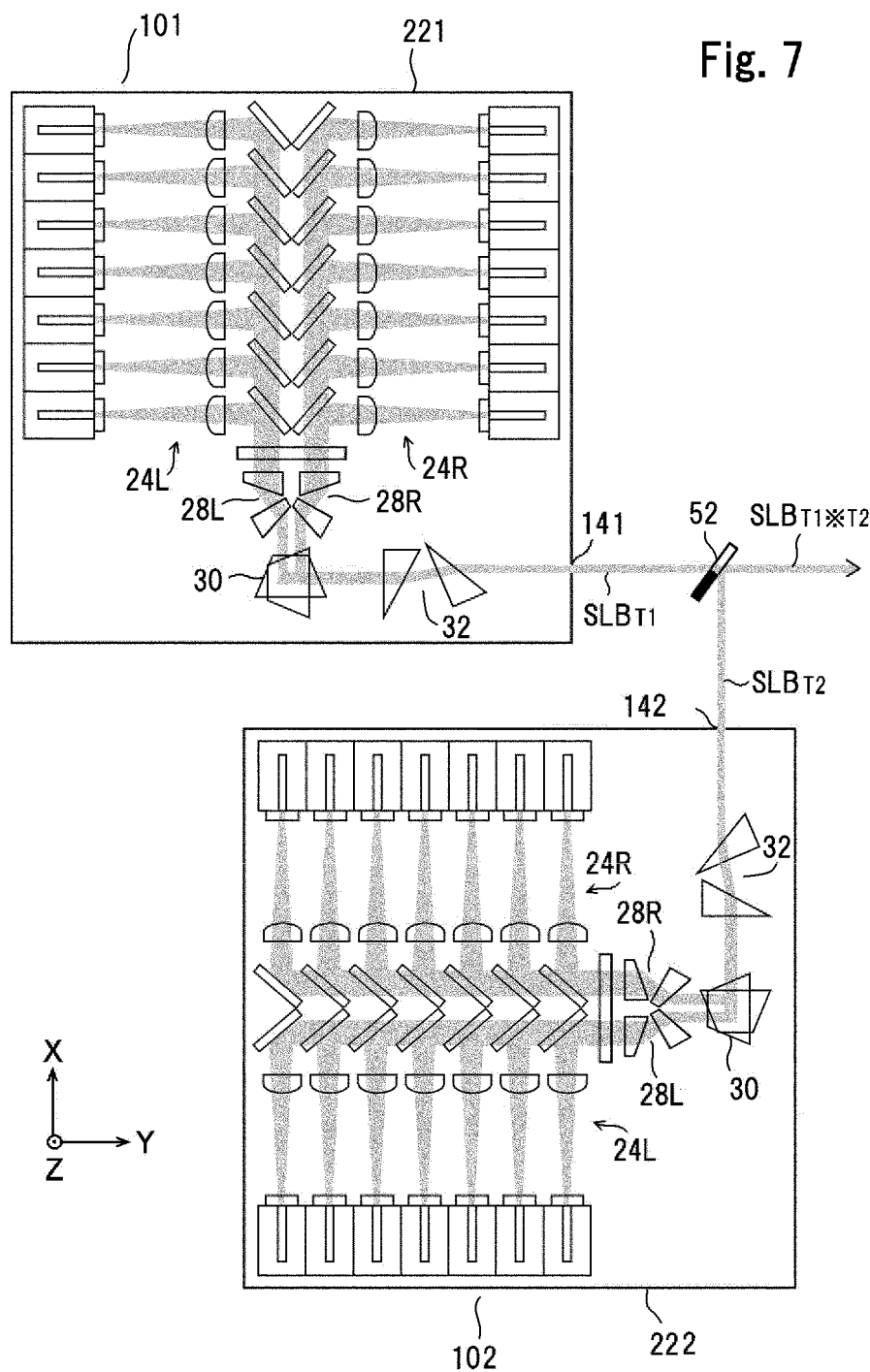
FIG. 7 is a schematic plan view illustrating a configuration of a laser device according to a first embodiment.

FIG. 7 illustrates a laser device according to a first embodiment. This laser device includes two laser units 101 and 102. Here, the unit bases 221 and 222 of both laser units 101 and 102 are attached to a common or sole main base (not illustrated) having a flush upper surface. The unit housing 12 may be omitted. However, the laser units 101 and 102 are disposed so that the combined stacked laser beams $SLB_{T1}$ and $SLB_{T2}$ having the same standard wavelength (for example, 880 nm) emitted from the respective laser emission ports 141 and 142 intersect each other orthogonally. In this example, the travelling directions of the first and second combined stacked laser beams $SLB_{T1}$ and $SLB_{T2}$ are referred to as Y and X-directions, respectively.

Figure 8:
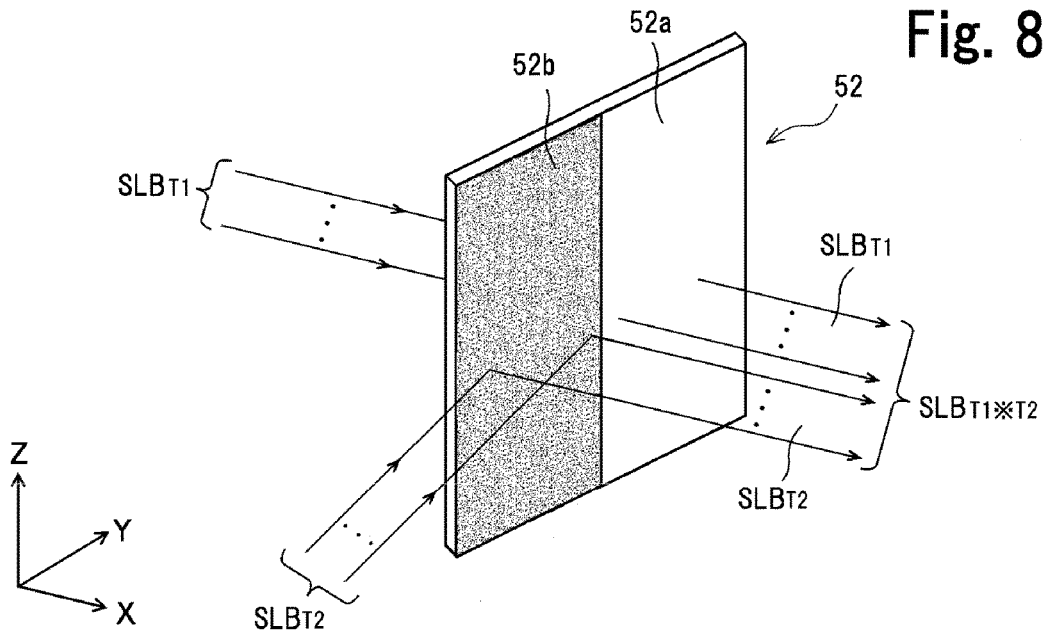
FIG. 8 is a perspective view illustrating a configuration and an operation of a stripe mirror (a spatial coupling element) provided in the laser device illustrated in FIG. 7.

More specifically, as illustrated in FIG. 8, a spatial coupling element (for example, a stripe mirror 52) that forms a transmission portion 52a and a reflection portion 52b which are adjacent to a plate surface tilted by 45° with respect to both of the X and Y-directions is provided at a position at which both combined stacked laser beams $SLB_{T1}$ and $SLB_{T2}$ intersect each other. The first combined stacked laser beam $SLB_{T1}$ ($LB_{L1}$ to $LB_{L7}$ and $LB_{R1}$ to $LB_{R7}$) from the first laser unit 101 is incident on the transmission portion 52a of the stripe mirror 52 in the X-direction and passes through continuously the transmission portion 52a along a straight line. On the other hand, the second combined stacked laser beam $SLB_{T2}$ ($LB_{L1}$ to $LB_{L7}$ and $LB_{R1}$ to $LB_{R7}$) from the second laser unit 102 is incident on the reflection portion 52b of the stripe mirror 52 in the Y-direction and is reflected at a right angle (that is, in the X-direction) from the reflection portion 52b. The stripe mirror 52 is configured such that, on a substrate formed of a glass plate, for example, a coating material transmissive to the laser beam $SLB_{T1}$ is applied to a region corresponding to the transmission portion 52a, and a coating material reflective to the laser beam $SLB_{T2}$ is applied to a region corresponding to the reflection portion 52b. The transmission portion 52a may also be formed as an opening.

Figure 9:
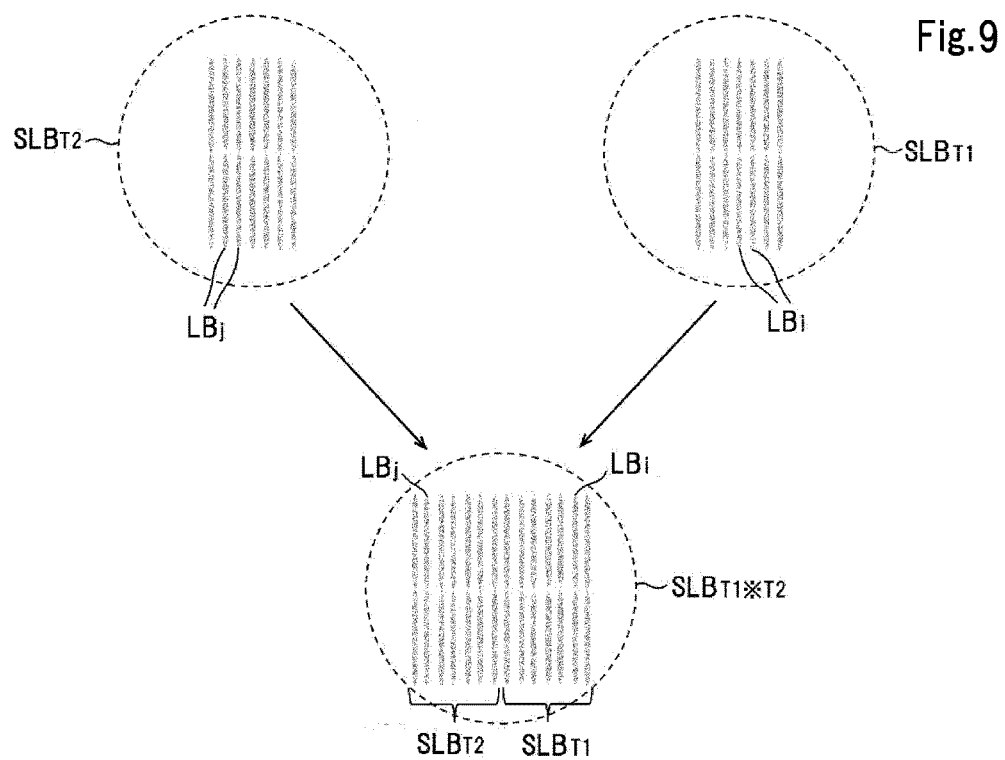
FIG. 9 is a diagram illustrating patterns (images) of laser beams in respective portions of the laser device illustrated in FIG. 7.

In this way, as illustrated in FIG. 9, a bundle of multiplexed combined stacked laser beams $SLB_{T1*T2}$ wherein the first combined stacked laser beam $SLB_{T1}$ and the second combined stacked laser beam $SLB_{T2}$ are arranged side by side in the Y-direction is emitted in the X-direction from the stripe mirror 52. This multiplexed combined stacked laser beam $SLB_{T1*T2}$ has light-concentration density and laser power obtained by adding the combined stacked laser beams $SLB_{T1}$ and $SLB_{T2}$ having substantially the same wavelength from the laser units 101 and 102.

This laser device requires high accuracy and stability with regards to optical alignment of the laser units 101, 102, and the stripe mirror 52 (among three components) in order to enhance spatial coupling accuracy of the multiplexed combined stacked laser beam $SLB_{T1*T2}$. In this embodiment, since the long axis of the respective single laser beams $LB_i$ and $LB_j$ included in the respective combined stacked laser beams $SLB_{T1}$ and $SLB_{T2}$ and the stripe of the stripe mirror 52 are both disposed to be orthogonal to a principal surface (the XY plane) of the main base, they are exactly parallel to each other. Hence, optical alignment can be easily and accurately performed just by adjusting the positions and/or the orientations of the three components 101, 102, and 52 on the main base plate. According to such an arrangement, in the stripe mirror 52, the respective single laser beams $LB_i$ of the first combined stacked laser beam $SLB_{T1}$ accurately pass through the transmission portion 52a and the respective single laser beams $LB_j$ of the second combined stacked laser beam $SLB_{T2}$ are accurately reflected from the reflection portion 52b. The reason why the beam rotation element 30 is provided in the laser unit 10 to rotate the image of the combined stacked laser beam $LB_{L/R}$ by 90° so that the long axes of the respective single laser beams $LB_i$ ($LB_j$) are converted from a horizontal direction to a vertical direction is to cause the combined stacked laser beam $LB_{L/R}$ to be orthogonal to the principal surface (the XY plane) of the main base.

Figure 10:
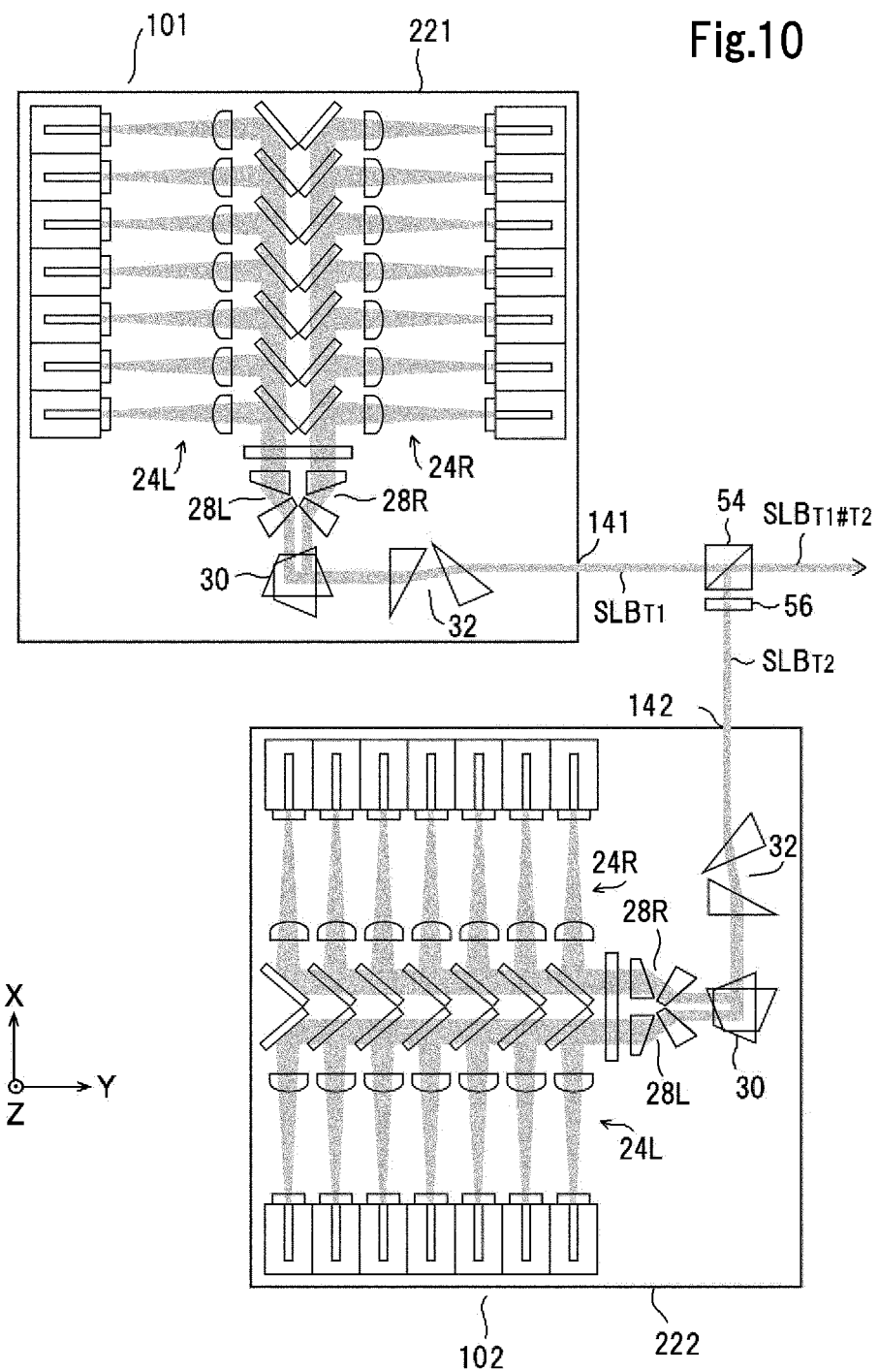
FIG. 10 is a schematic plan view illustrating a configuration of a laser device according to a second embodiment.
Figure 11:
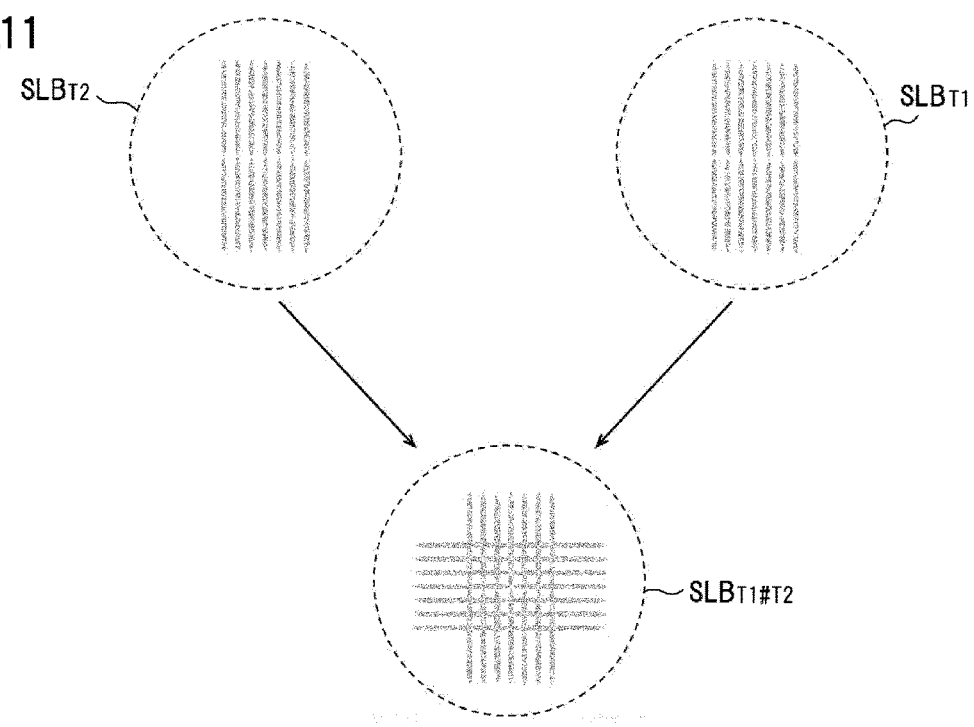
FIG. 11 is a diagram illustrating patterns (images) of laser beams in respective portions of the laser device illustrated in FIG. 10.

FIG. 10 illustrates a configuration of a laser device according to a second embodiment. This laser device has a similar configuration to the laser device of the first embodiment except that the spatial coupling element 52 is replaced with a polarizing coupling element 54. A ½ wavelength plate 56 is disposed between the polarizing coupling element 54 and one of the laser units 101 and 102. The polarizing coupling element 54 is configured from a polarizing beam splitter (PBS) for example, and combines orthogonal components of polarized beams of the combined both of stacked laser beams $SLB_{T1}$ and $SLB_{T2}$ by this polarization coupling as illustrated in FIG. 11. The light-concentration density and the laser power of one bundle of multiplexed combined stacked laser beams $SLB_{T1\#T2}$ obtained by polarization coupling are obtained by adding the combined stacked laser beams $SLB_{T1}$ and $SLB_{T2}$ having substantially the same wavelength from the laser units 101 and 102.

Figure 12:
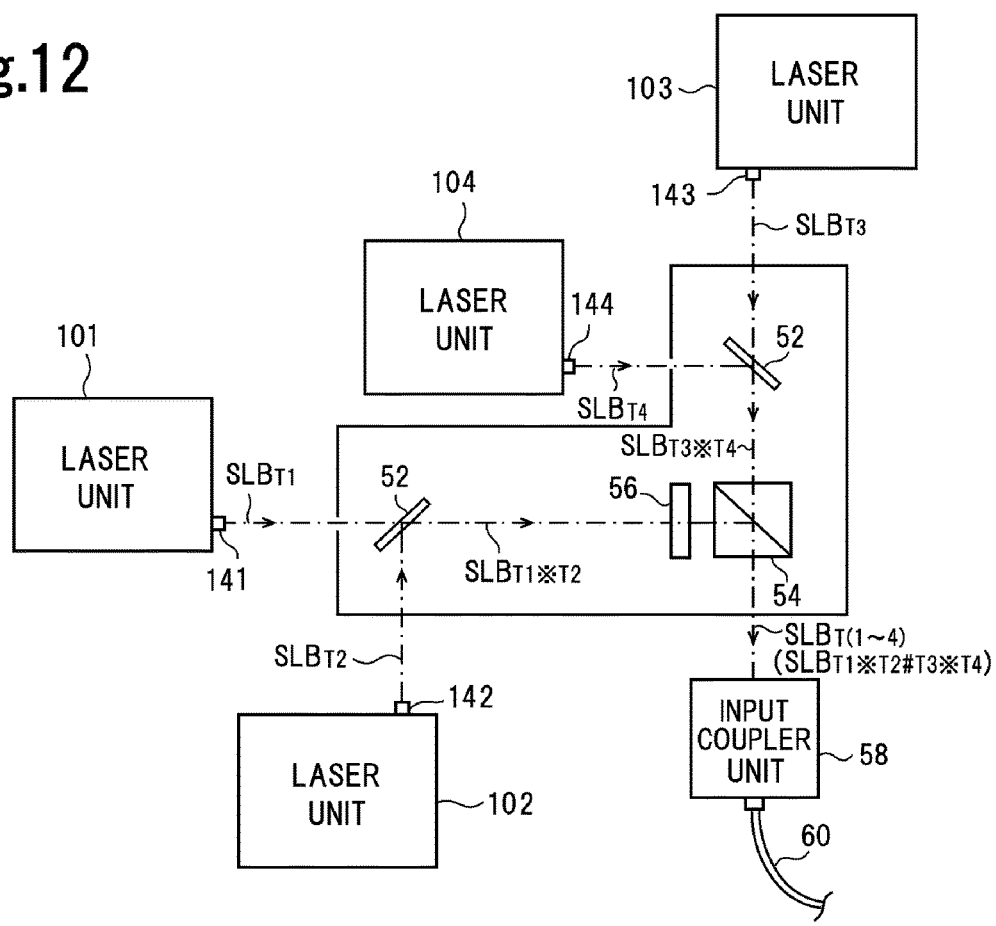
FIG. 12 is a schematic plan view illustrating a configuration of a laser device according to a third embodiment.

A laser device according to a third embodiment illustrated in FIG. 12 includes a larger number of laser units, such as four laser units 101, 102, 103, and 104, for example, and is configured to use both the spatial coupling and the polarization coupling described above.

Figure 13A:
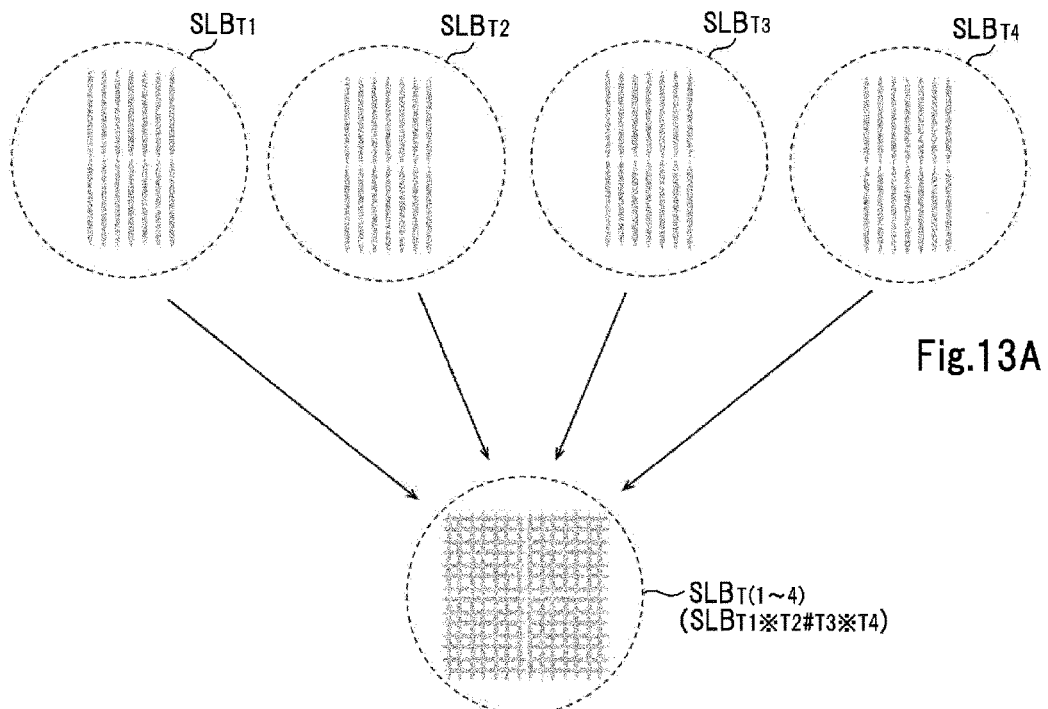
FIG. 13A is a diagram illustrating patterns (images) of laser beams in respective portions of the laser device illustrated in FIG. 12.
Figure 13B:
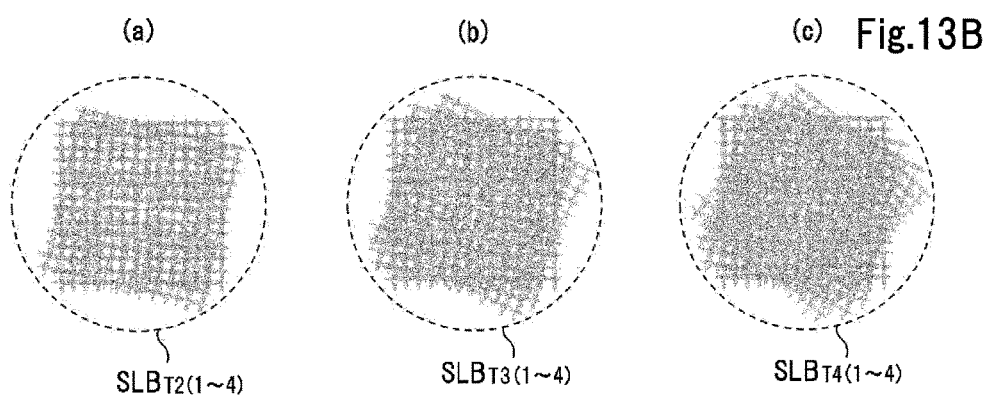
FIG. 13B is a diagram illustrating patterns (images) of laser beams in respective portions of a laser device according to another embodiment.

Here, a bundle of first multiplexed combined stacked laser beams $SLB_{T1*T2}$ is obtained by spatially coupling both of the combined stacked laser beams $SLB_{T1}$ and $SLB_{T2}$ emitted from the laser units 101 and 102, respectively, bypassing the beams through the first spatial coupling element 52. On the other hand, a bundle of second multiplexed combined stacked laser beams $SLB_{T3*T4}$ is obtained by spatially coupling combined stacked laser beams $SLB_{T3}$ and $SLB_{T4}$ emitted from the laser units 103 and 104, respectively, by passing the beams through the second spatial coupling element 52. Moreover, a bundle of multiplied multiplexed combined stacked laser beams $SLB_{T1*T2\#T3*T4}$ (that is, $SLB_{T(1\sim4)}$) is obtained by polarization coupling of the first and second multiplexed combined stacked laser beams $SLB_{T1*T2}$ and $SLB_{T3*T4}$ by passing the beams through the ½ wavelength plate 56 and the PBS 54. FIG. 13A illustrates a coupling relation between the multiplied multiplexed combined stacked laser beam $SLB_{T(1\sim4)}$ and the respective combined stacked laser beams $SLB_{T1}$ to $SLB_{T4}$.

If the laser units 101 to 104 have similar wavelength and power, the multiplied multiplexed combined stacked laser beam $SLB_{T(1\sim4)}$ has light-concentration density and laser power that are integer multiples (4 times larger) of those of one laser unit 10, the integer corresponding to the number of the laser units 10 (four in the illustrated example).

In FIG. 12, one bundle of multiplied multiplexed combined stacked laser beams $SLB_{T(1\sim4)}$ obtained from the PBS 54 is input to an optical fiber 60 via an input coupler unit 58 including a condensing lens, propagates through the optical fiber 60, and is delivered to a remote output unit (not illustrated). In the output unit, the multiplied multiplexed combined stacked laser beams $SLB_{T(1\sim4)}$ output in a single mode from the other end of the optical fiber 60 are condensed and irradiated towards a workpiece and are provided for desired laser processing (for example, welding).

In another embodiment, wavelength coupling may be used together with the spatial coupling and/or the polarization coupling described above. Wavelength coupling is a coupling method of combining or multiplexing a plurality of laser beams having different standard wavelengths, exemplary using a dichroic mirror. For example, a multiplied multiplexed combined stacked laser beam $SLB_{T(1\sim4)}$ obtained by a set of four laser units 101 to 104 as illustrated in FIG. 12 having a first standard wavelength (for example, 880 μm) and a multiplied multiplexed combined stacked laser beam $SLB_{T(1\sim4)}$ obtained by another set of four laser units 101 to 104 having a second standard wavelength (for example, 915 μm) are multiplexed and combined by two-wavelength coupling as illustrated in part (a) of FIG. 13B to obtain a bundle of multiplexed combined stacked laser beams $SLB_{T2(1\sim4)}$. In this way, it is possible to further increase the laser power two times. By the same principle, by using other laser beams of other standard wavelengths such as 940 μm, 960 μm, and 975 μm, for example, it is also possible to obtain a multiplexed combined stacked laser beam $SLB_{T3(1-4)}$ of three-wavelength coupling as illustrated in part (b) of FIG. 13B or a multiplexed combined stacked laser beam $SLB_{T4(1-4)}$ of four-wavelength coupling as illustrated in part (c) of FIG. 13B. In this way, laser power can easily be increased three times, four times, or more. Moreover, in this embodiment, since the laser units 101 to 104 include the above-described wavelength stabilizing element (for example, VBG) 26 and the wavelengths of the combined stacked laser beams $SLB_{T1}$ to $SLB_{T4}$ obtained from these laser units 101 to 104, respectively, are locked at values near the standard wavelengths. Therefore, multiplexed wavelength coupling described above can be performed accurately and stably.

According to the laser device of this embodiment, with the above-described high-accuracy composite coupling, it is possible to easily and efficiently realize high power of 1 kW or more in fiber coupling which uses a narrow optical fiber having a diameter of Φ50 μm for applications such as DDL, for example.

Other Embodiment or Modification

Figure 14:
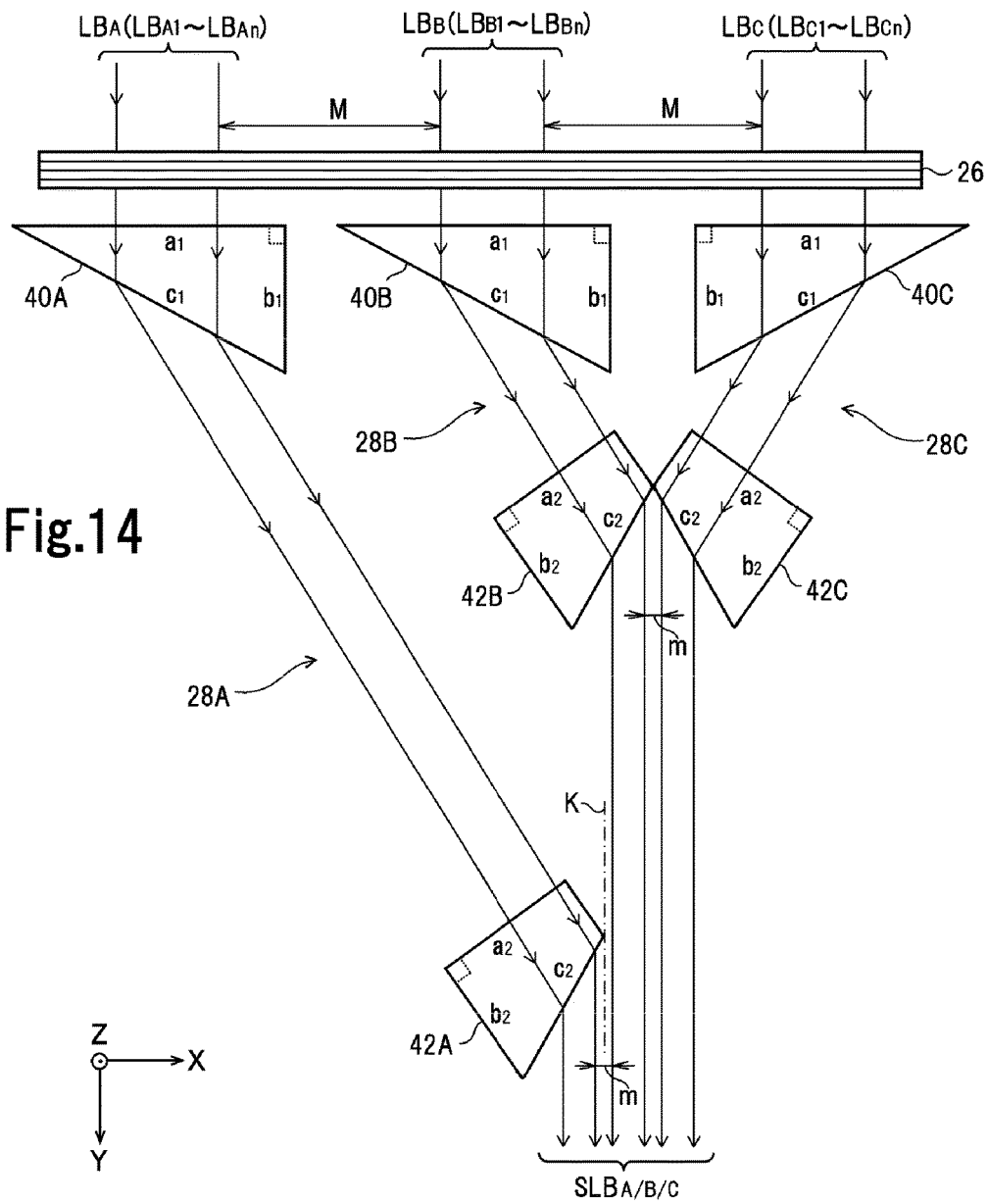
FIG. 14 is a diagram illustrating a modification of a primary anamorphic prism assembly according to an embodiment.

In this embodiment, the laser unit 10 of the may have three or more stacked laser beam creation units 24 of the above configuration may be mounted on the unit base 22. In this case, for example, a single VBG 26 and three anamorphic prisms 28A, 28B, and 28C may be used for three sets of stacked laser beams $SLB_A$, $SLB_B$, and $SLB_C$ formed by three stacked laser beam creation units 24A, 24B, and 24C (not illustrated), respectively. FIG. 14 illustrates a layout.

That is, two anamorphic prisms 28B and 28C correspond to the two anamorphic prisms 28L and 28R in the embodiment (FIG. 4) and the anamorphic prism 28A at the end (left end) is added thereto in parallel. Here, the anamorphic prism 28A is configured with a front-stage right-angle prism 40A which is positioned near the VBG 26 and is disposed so that one (the longer) adjoining side $a_1$ faces in parallel to the VBG 26 and the other (the shorter) adjoining side $b_1$ faces in parallel to a virtual reference line K that meets a combined stacked laser beam $SL_{B/C}$, and a rear-stage right-angle prism 42A which is positioned on the backward side far away from the front-stage right-angle prism 40A in a beam travelling direction (the Y-direction) and is disposed so that one adjoining side $a_2$ obliquely faces an oblique side $c_1$ of the front-stage right-angle prism 40A at a certain angle and an oblique side $c_2$ obliquely faces the merging reference line K at a close distance. Here, since a large part of the corner portion between the adjoining side $a_2$ and the oblique side $c_2$ of the rear-stage right-angle prism 42A is cut off, and the oblique side $c_2$ is brought close to the merging reference line K as much as possible, the optical path of the stacked laser beam $SLB_A$ ($LB_{A1}$ to $LB_{A7}$) immediately after passing through the rear-stage right-angle prism 42A is shifted greatly in the X-direction so that the optical path almost makes contact with the merging reference line K.

In this way, the stacked laser beams $SLB_B$ and $SLB_C$ are combined in two lines to obtain of combined laser beams $SLB_{B/C}$ to which the stacked laser beam $SLB_A$ is added in parallel, whereby a bundle of three lines of combined stacked laser beams $SLB_{A/B/C}$ (FIG. 15) is obtained.

When three independent bundles of stacked laser beams $SLB_A$, $SLB_B$, and $SLB_C$ are combined in three lines to obtain a bundle of combined stacked laser beams $SLB_{A/B/C}$, it is preferable that the compression ratio in the beam's long-axis direction (the slow-axis direction) of the respective anamorphic prisms 28A, 28B, and 28C is set to be ⅓ or smaller.

Moreover, as illustrated in FIG. 16, a DOVE prism 62 may be used as a modification of the beam rotation element 30 of the laser unit 10 according to the embodiment. In this case, the combined stacked laser beam $SLB_{L/R}$ having passed through the primary anamorphic prisms 28L and 28R (FIG. 2) in the Y-direction is incident on one inclined end surface of the DOVE prism 62 and then is totally reflected from a bottom surface of the prism 62, and finally exits from one inclined end surface in the Y-direction. In this case, the pattern or the image of the combined stacked laser beam $SLB_{L/R}$ rotates by 90° before the beam is incident on the DOVE prism 62 and after the beam exits therefrom.

When the DOVE prism 62 is used in this manner, since the size of the beam rotation element 30 in the longitudinal direction (the Y-direction) of the laser unit (FIG. 2) increases greatly and the rear-stage secondary anamorphic prism 32 is disposed on an extension line of the Y-direction, the size of the unit base 22 and the entire laser unit 10 tends to increase further. In this regard, the mirror-type beam rotation element 30 (FIG. 5) is advantageous over the DOVE prism 62.

Moreover, in the laser unit 10 according to the embodiment, each of the mirrors 38Ln (38Rn) for reflecting the single laser beams $LB_{Ln}$ ($LB_{Rn}$) from the single emitters LDs 36Ln (36Rn) may have (share) the function of the slow-axis collimator lenses 42Ln (42Rn), respectively.

Figure 17:
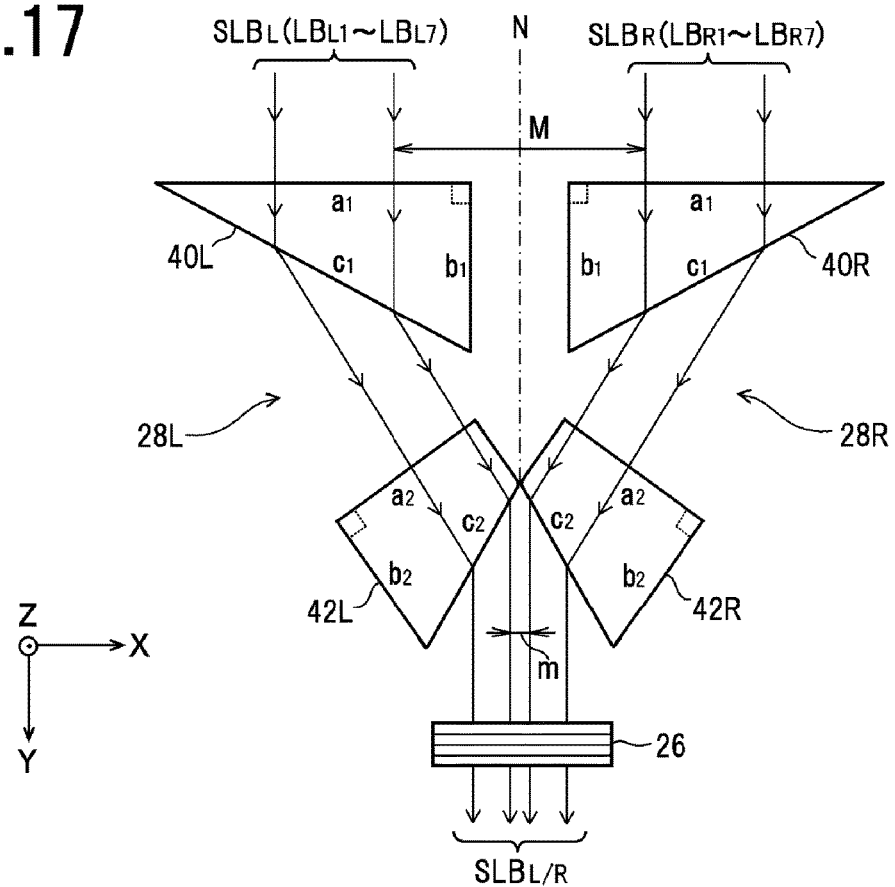
FIG. 17 is a plan view illustrating an example of an arrangement configuration of wavelength stabilizing elements.

In the above embodiment, a single VBG 26 is disposed between the stacked laser beam creation units 24L and 24R and the primary anamorphic prisms 28L and 28R. As another embodiment, as illustrated in FIG. 17, the VBG 26 may be arranged on the optical path after the stacked laser beams $SLB_L$ and $SLB_R$ pass through the primary anamorphic prisms 28L and 28R (that is, the optical path of the combined stacked laser beam $SLB_{L/R}$). According to this arrangement, since the size of the VBG 26 can be reduced to a size that covers one bundle of the combined stacked laser beam $SLB_{L/R}$, it is possible to further reduce the size and the cost of the VBG 26.

REFERENCE SIGNS LIST 10, 101, 102, 103, 104 Laser unit,
22, 221, 222 Unit base,
24L, 24R Stacked laser beam creation unit
26 VBG
28L, 28R Primary anamorphic prism
30 Beam rotation element
32 Secondary anamorphic prism
36R1 to 36R7, 36L1 to 36L7 Single emitter LD
38R1 to 38R7, 38L1 to 38L7 Mirror
52 Spatial coupling element, Stripe mirror

The invention claimed is:

1. A laser unit comprising:
a first stacked laser beam creation unit having a plurality of first single emitter laser diodes (LDs) disposed in a first direction at a plurality of different height positions with a predetermined pitch, each of the plurality of first single emitter LDs emitting a first single laser beam having a wavelength identical or proximate to a standard wavelength, a plurality of first single laser beams arranged in a stacked form and not contacting each other to create a first stacked laser beam bundle being shifted to one side from a predetermined center line (N) and propagating in parallel to the center line (N);
a second stacked laser beam creation unit disposed adjacent to the first stacked laser beam creation unit and having a plurality of second single emitter LDs disposed in the first direction at the plurality of different height positions with the predetermined pitch, each of the plurality of second single emitter LDs emitting a second single laser beam having a wavelength identical or proximate to the standard wavelength, a plurality of second single laser beams arranged in a stacked form and not contacting each other to create a second stacked laser beam bundle being shifted to another side from the center line (N) and propagating in parallel to the center line (N);

a first anamorphic prism that allows the first stacked laser beam bundle from the first stacked laser beam creation unit to pass therethrough, wherein a beam size of individual first single laser beams that form the first stacked laser beam bundle is compressed by a first compression ratio in one of a fast-axis direction and a slow-axis direction, and an optical path of the first stacked laser beam bundle is shifted so as to approach the center line (N); and a second anamorphic prism that allows the second stacked laser beam bundle from the second stacked laser beam creation unit to pass therethrough, wherein a beam size of the individual second single laser beams that form the second stacked laser beam bundle is compressed by a second compression ratio in the one of the fast-axis direction and the slow-axis direction, and an optical path of the second stacked laser beam bundle is shifted so as to approach the center line (N), wherein a combined stacked laser beam bundle combining the first stacked laser beam bundle and the second stacked laser beam bundle being arranged in two lines is obtained on a subsequent stage of first and second anamorphic prisms.

2. The laser unit according to claim 1, wherein the first stacked laser beam creation unit includes:

a first step-shaped LD supporting portion having disposed thereon the plurality of first single emitter LDs, a laser emission surface of each of the plurality of first single emitter LDs facing a second direction orthogonal to the first direction, the plurality of first single emitter LDs being arranged in a third direction orthogonal to the first and second directions and placed at the plurality of different height positions in the first direction with the predetermined pitch;

a plurality of first mirrors that reflect the plurality of first single laser beams emitted respectively in the second direction from the plurality of first single emitter LDs toward the first anamorphic prism in the third direction at the plurality of different height positions in the first direction with the predetermined pitch;

a first fast-axis collimator lens that is disposed between each of a corresponding one of the first single emitter LDs and each of a corresponding one of the first mirrors that face each other so as to collimate each of a corresponding one of the first single laser beams in the fast-axis direction; and a first slow-axis collimator lens that is disposed between each of the corresponding one of the first single emitter LDs and each of the corresponding one of the first mirrors that face each other so as to collimate each of the corresponding one of the first single laser beams in the slow-axis direction.

3. The laser unit according to claim 2, wherein the second stacked laser beam creation unit includes:

a second step-shaped LD supporting portion which faces the first step-shaped LD supporting portion in the second direction and on which the plurality of second single emitters LDs of which respective laser emission surfaces face in the second direction are arranged in the third direction and are placed at different heights in the first direction corresponding to the pitch;

a plurality of second mirrors that reflects the second single laser beams emitted respectively in the second direction from the plurality of second single emitters LDs toward the second anamorphic prism in the third direction to different heights in the first direction corresponding to the pitch;

a second fast-axis collimator lens that is disposed between each of a corresponding one of the second single emitter LDs and each of a corresponding one of the second mirrors that face each other so as to collimate each of a corresponding one of the second single laser beams in the fast-axis direction; and a second slow-axis collimator lens that is disposed between each of the corresponding one of the second single emitter LDs and each of the corresponding one of the second mirrors that face each other so as to collimate each of the corresponding one of the second single laser beams in the slow-axis direction.

4. The laser unit according to claim 3, further comprising:

a beam rotation element that rotates an image of the combined stacked laser beam bundle obtained from the first and second anamorphic prisms by a predetermined angle; and a third anamorphic prism that compresses a beam size of the individual first and second single laser beams that form the combined laser beam bundle having passed through the beam rotation element by a third compression ratio in the other of the fast-axis direction or the slow-axis direction.

5. The laser unit according to claim 4, wherein the beam rotation element includes:

a third mirror that has a first reflecting surface that is parallel to the second direction and is tilted by 45° with respect to the third direction and is disposed so that the combined stacked laser beam bundle from the first and second anamorphic prisms is incident on the first reflecting surface;

a fourth mirror that has a second reflecting surface that is parallel to the third direction and is tilted by 45° with respect to the second direction and is disposed so that the combined stacked laser beam bundle reflected from the first reflecting surface of the first mirror is incident on the second reflecting surface.

6. A laser device comprising:

a first laser unit according to claim 1 that emits a first combined stacked laser beam in a fourth direction orthogonal to the first direction;

a second laser unit according to claim 1 that emits a second combined stacked laser beam in a fifth direction orthogonal to the first and fourth directions; and a spatial coupling element that has a transmission portion and a reflection portion arranged to be adjacent to each other in a direction inclined by 45° with respect to the fourth and fifth directions, the spatial coupling element allowing the first combined stacked laser beam from the first laser unit and the second combined stacked laser beam from the second laser unit to be selectively incident on the transmission portion and the reflection portion to combine the first combined stacked laser beam and the second combined stacked laser beam into a bundle of laser beams in a multiplexed manner and in a non-contacting manner.

7. A laser device comprising:
a first laser unit according to claim 1 that emits a first combined stacked laser beam in a fourth direction orthogonal to the first direction;
a second laser unit according to claim 1 that emits a second combined stacked laser beam in a fifth direction orthogonal to the first and fourth directions; and
a polarizing coupling element that combines the first combined stacked laser beam from the first laser unit and the second combined stacked laser beam from the second laser unit into a bundle of laser beams in a multiplexed manner by polarization coupling.

8. A laser device comprising:
a first laser unit according to claim 1 that emits a first combined stacked laser beam having a wavelength near a first standard wavelength in a fourth direction orthogonal to the first direction;
a second laser unit according to claim 1 that emits a second combined stacked laser beam having a wavelength near a second standard wavelength that does not interfere with the first standard wavelength in a fifth direction orthogonal to the first and fourth directions; and
a wavelength coupling element that combines the first combined stacked laser beam from the first laser unit and the second combined stacked laser beam from the second laser unit into a bundle of laser beams in a multiplexed manner by wavelength coupling.

9. The laser unit according to claim 1, wherein
the first and second anamorphic prisms each include:
a front-stage right-angle prism (40L, 40R) disposed so that one adjoining side ($a_1$) extends in a direction orthogonal to the center line (N) and another adjoining side ($b_1$) extends in parallel to the center line (N); and
a rear-stage right-angle prism (42L, 42R) disposed on a backward side of the front-stage right-angle prism (40L, 40R) in a beam travelling direction so that one adjoining side ($a_2$) obliquely faces an oblique side ($c_1$) of the front-stage right-angle prism at a certain angle and an oblique side ($c_2$) of the rear-stage right-angle prism (42L, 42R) obliquely faces the center line (N) at a close distance, and
a corner portion between the adjoining side ($a_2$) and the oblique side ($c_2$) is cut off so that the oblique side ($c_2$) approaches the center line (N).

10. The laser unit according to claim 1, further comprising:
a single wavelength stabilizing element for stabilizing the wavelengths of the individual first and second single laser beams that form the first and second stacked laser beams to values near the standard wavelength simultaneously to narrow a bandwidth.

* * * * *